(12) United States Patent
Xu

(10) Patent No.: US 11,756,612 B2
(45) Date of Patent: Sep. 12, 2023

(54) ALL LEVELS DYNAMIC START VOLTAGE PROGRAMMING OF A MEMORY DEVICE IN A MEMORY SUB-SYSTEM

(71) Applicant: Micron Technology, Inc., Boise, ID (US)

(72) Inventor: Jun Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/301,139

(22) Filed: Mar. 26, 2021

(65) Prior Publication Data

US 2022/0310158 A1   Sep. 29, 2022

(51) Int. Cl.
| | | |
|---|---|---|
| *G11C 11/34* | (2006.01) | |
| *G11C 11/56* | (2006.01) | |
| *G11C 16/34* | (2006.01) | |
| *G11C 16/10* | (2006.01) | |
| *G11C 16/04* | (2006.01) | |

(52) U.S. Cl.
CPC ...... *G11C 11/5628* (2013.01); *G11C 11/5671* (2013.01); *G11C 16/0483* (2013.01); *G11C 16/10* (2013.01); *G11C 16/3459* (2013.01)

(58) Field of Classification Search
CPC ............ G11C 11/5671; G11C 16/0483; G11C 11/5628; G11C 16/10; G11C 16/3459
See application file for complete search history.

(56) References Cited

U.S. PATENT DOCUMENTS

| | | | |
|---|---|---|---|
| 2011/0019471 A1* | 1/2011 | Cernea ................ | G11C 11/5628 365/185.03 |
| 2015/0357031 A1* | 12/2015 | Tang ................... | G11C 11/5628 365/185.03 |
| 2018/0211715 A1* | 7/2018 | Cho .................... | G11C 11/5628 |

* cited by examiner

*Primary Examiner* — Uyen Smet
(74) *Attorney, Agent, or Firm* — Lowenstein Sandler LLP

(57) ABSTRACT

Control logic in a memory device identifies a set of a plurality of memory cells configured as multi-level cell (MLC) memory to be programmed during a program operation and causes one or more programming pulses to be applied to the set of the plurality of memory cells configured as MLC memory to program memory cells in the set of memory cells configured as MLC memory to respective programming levels of a plurality of programming levels as part of the program operation. Responsive to the one or more programming pulses being applied, the control logic further performs a program verify operation to verify whether the memory cell in the set of memory cells configured as MLC memory were programmed to the respective programming levels of the plurality of programming levels.

12 Claims, 5 Drawing Sheets

ALL LEVELS DYNAMIC START VOLTAGE PROGRAMMING OF A MEMORY DEVICE IN A MEMORY SUB-SYSTEM

TECHNICAL FIELD

Embodiments of the disclosure relate generally to memory sub-systems, and more specifically, relate to all levels dynamic start voltage programming of a memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
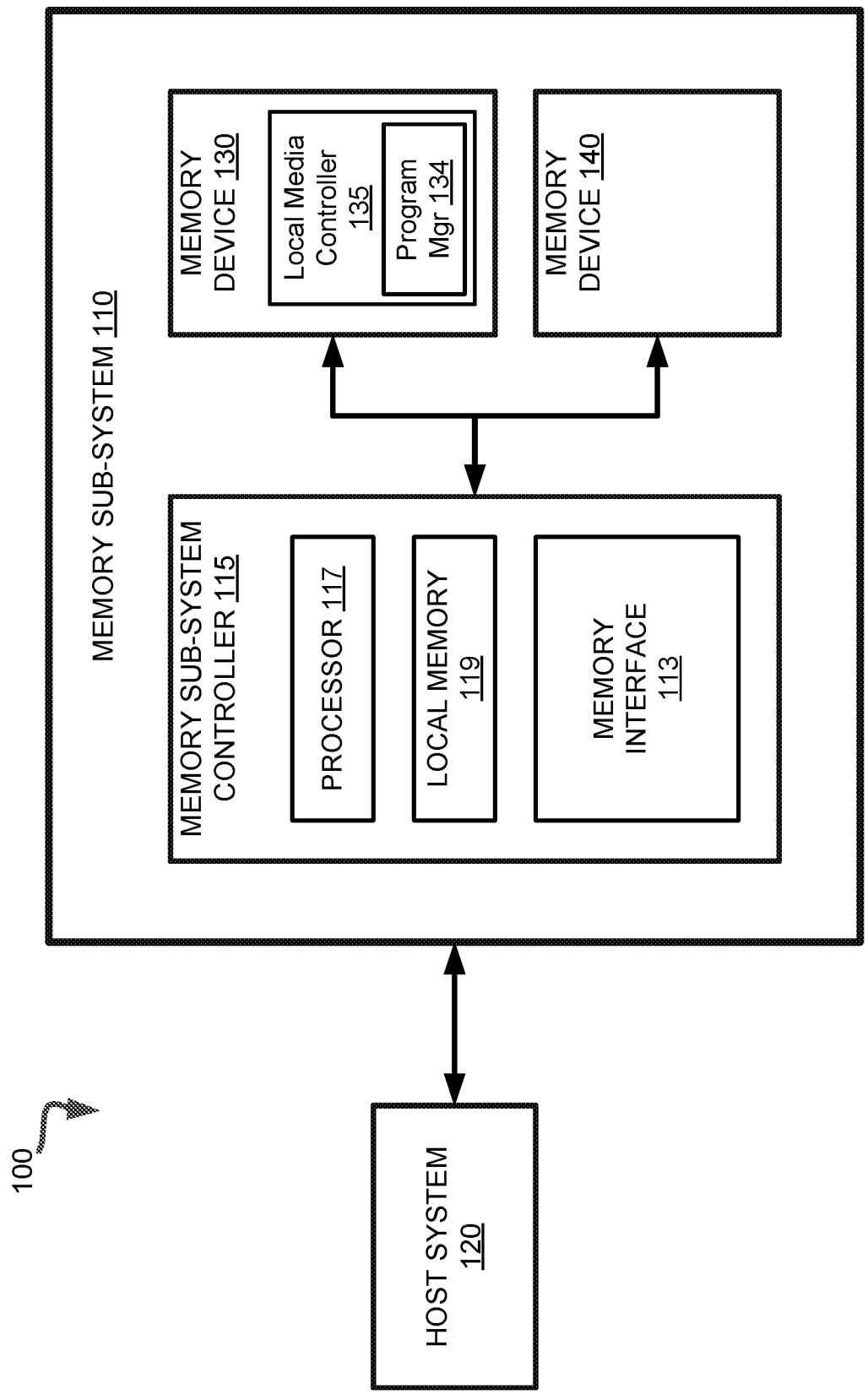
FIG. 1 illustrates an example computing system that includes a memory sub-system in accordance with some embodiments of the present disclosure.

Aspects of the present disclosure are directed to all levels dynamic start voltage (DSV) programming of a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e. in stripes). Accordingly, one request to read a segment of data (e.g., corresponding to one or more data addresses), can result in read operations performed on two or more of the memory planes of the memory device.

Some memory devices use certain types of memory cells, such as quad-level cell (QLC) memory cells, which store four bits of data in each memory cell, which make it affordable to move more applications from legacy hard disk drives to newer memory sub-systems, such as NAND solid-state drives (SSDs). QLC memory is particularly well-tuned for read-intensive workloads, which are often seen in data center applications where data is normally generated once, and then read regularly to perform calculations and analysis. Thus, QLC memory is often considered to be fragile and used only for very light write workloads, as the endurance and Quality of Service (QoS) can limit usability in data center applications.

Certain memory sub-systems implementing QLC memory use a standard 16-16 coarse-fine, two pass, programming algorithm. Since a QLC memory cell stores four bits of data, there are 16 possible programming levels (i.e., $2^4$) representing the possible values of those four bits of data. Programming a wordline begins by coarsely programming all 16 levels in a first pass. The objective of this "coarse," first pass is to program all cells to slightly below their final target programming levels. During the slower, "fine," second pass, the memory cells are programmed to a slightly higher final target programmed voltage. Such two-pass programming minimizes cell to cell (C2C) interference, as every cell and its neighbors are nearly at their final target programmed voltage when the fine programming pass is performed, and need only be "touched-up." In such standard 16-16 coarse-fine programming, a first pulse corresponding to a first programming level is applied to all cells being programmed (e.g., all cells of a wordline). Subsequently, a program verify operation is performed to verify that the memory cells intended to be programmed to the first programming level reached the corresponding target voltage level. Those cells that pass the program verify operation are inhibited while a second pulse corresponding to a second programming level is applied to the remaining cells. Another program verify operation is performed, and this sequence continues with additional pulses and program verify operation until the programming is complete. By following each programming pulse with a program verify operation, accurate programming results can be achieved, but each transition between a program phase and a program verify phase adds latency to the programming process, as different voltage pumps are turned on/off, reference voltages are prepared, etc. Accordingly, the entire program time associated with performing the program operation on memory device is relatively lengthy, which negatively impacts performance in the memory sub-system.

Aspects of the present disclosure address the above and other deficiencies by implementing all levels dynamic start voltage (DSV) programming of a memory device in a memory sub-system. In one embodiment, rather than performing intermediate program verify operations after each programming level is reached, the memory cells of the memory device can be programmed to multiple different programming levels before a program verify operation is performed. In one embodiment, all of the programming levels (e.g., 16 programming levels for QLC memory) are applied before the program verify operation is performed at the end. For example, upon identifying a set of memory cells to be programmed (e.g., the memory cells associated with one or more wordlines of a memory array), control logic of the memory device can cause a number of programming pulses to be applied to the identified set of memory cells to program those memory cells to multiple respective programming levels (i.e., L1, L2, . . . L15). Once all programming pulses have been applied, the control logic can perform a program verify operation to verify whether the memory cells in the set were programmed to the respective programming levels.

Advantages of this approach include, but are not limited to, improved performance in the memory sub-system. As fewer transitions between programming phases and program verify phases are performed, the total programming time is reduced. As fewer program verify operations are performed, the latency associated with program verify start and recovery times is minimized, and the total programming time is reduced. Accordingly, the overall quality of service level provided by the memory sub-system is improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as QLC memory. The voltage levels of the memory cells in QLC memory form a set of 16 programming distributions representing the 16 different combinations of the four bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

Depending on the programming scheme used, each logical page of a memory cell can be programmed in a separate programming pass, or multiple logical pages can be programmed together. For example, in a QLC physical page, the LP and UP can be programmed on one pass, and the XP and TP can be programmed on a second pass. Other programming schemes are possible. In one embodiment, program manager 134 can receive, for example, four pages of host data to be programmed to the QLC memory. Accordingly, in order for one bit from each of the four pages to be programmed to each memory cell, program manager 134 can program each memory cell to one of 16 possible programming levels (i.e., voltages representing the 16 different values of those four bits). Thus, the four pages of host data will be represented by 16 different programming distributions. In one embodiment, program manager 134 can program memory cells in the QLC portion of the memory array to multiple respective programming levels (e.g., 16 programming levels) before performing a subsequent program verify operation. For example, upon identifying a set of memory cells to be programmed (e.g., the memory cells associated with one or more wordlines of the memory array), program manager 134 can cause a number of programming pulses to be applied to the identified set of memory cells to program those memory cells to multiple respective programming levels (i.e., L1, L2, . . . L15). Once all programming pulses have been applied, program manager 134 can perform a program verify operation to verify whether the memory cells in the set were programmed to the respective programming levels. Further details with regards to the operations of program manager 134 are described below.

Figure 2:
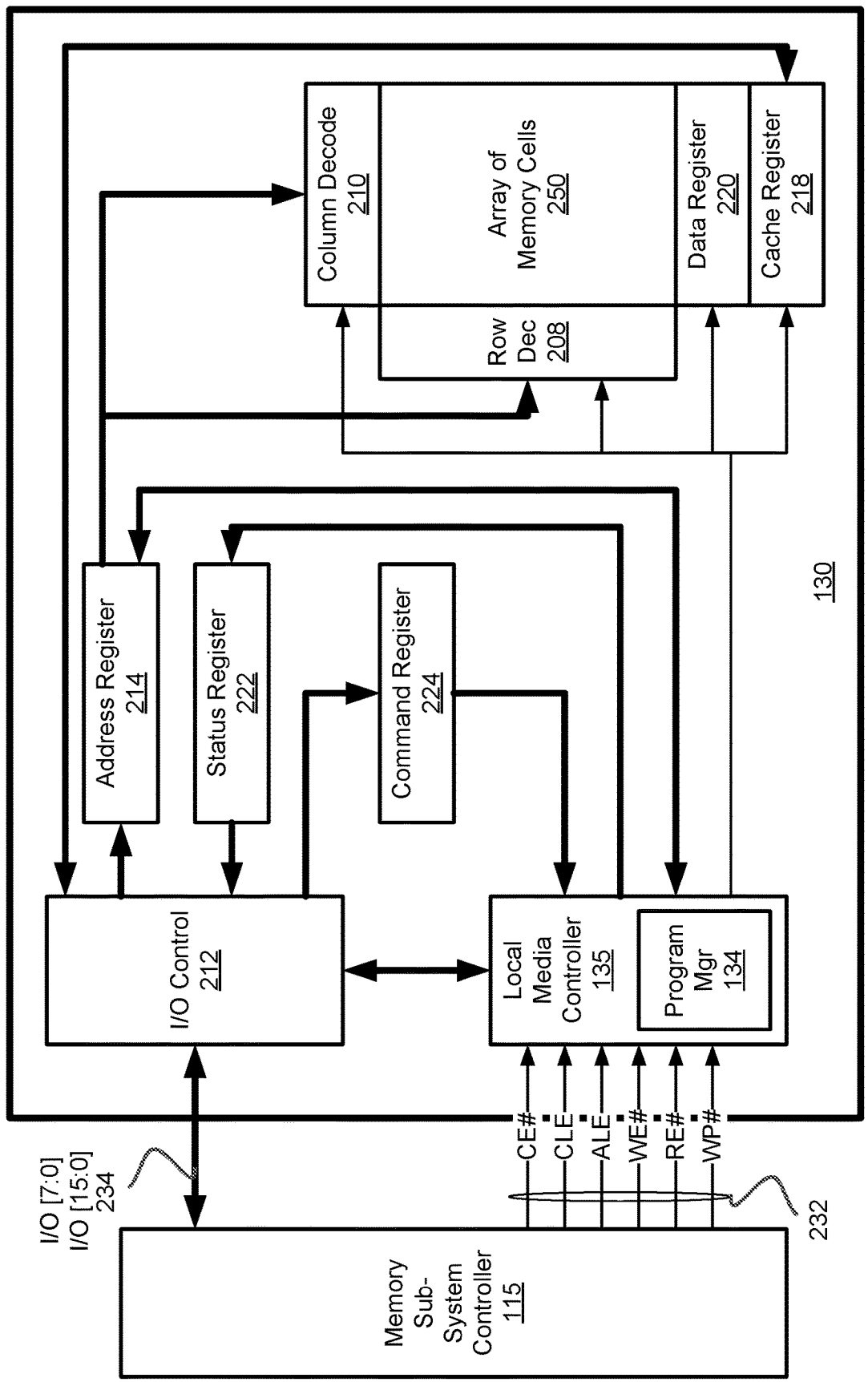
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 250 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 250 are capable of being programmed to one of at least two target data states.

Row decode circuitry 208 and column decode circuitry 210 are provided to decode address signals. Address signals are received and decoded to access the array of memory cells 250. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 250 in response to the commands and generates status information for the external memory sub-system controller 115, i.e., the local media controller 135 is configured to perform access operations (e.g., read operations, programming operations and/or erase operations) on the array of memory cells 250. The local media controller 135 is in communication with row decode circuitry 208 and column decode circuitry 210 to control the row decode circuitry 208 and column decode circuitry 210 in response to the addresses. In one embodiment, local media controller 134 includes program manager 134, which can implement the all levels dynamic start voltage (DSV) programming of memory device 130, as described herein.

The local media controller 135 is also in communication with a cache register 218. Cache register 218 latches data, either incoming or outgoing, as directed by the local media controller 135 to temporarily store data while the array of memory cells 250 is busy writing or reading, respectively, other data. During a program operation (e.g., write operation), data may be passed from the cache register 218 to the data register 220 for transfer to the array of memory cells 250; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 250, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 250.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
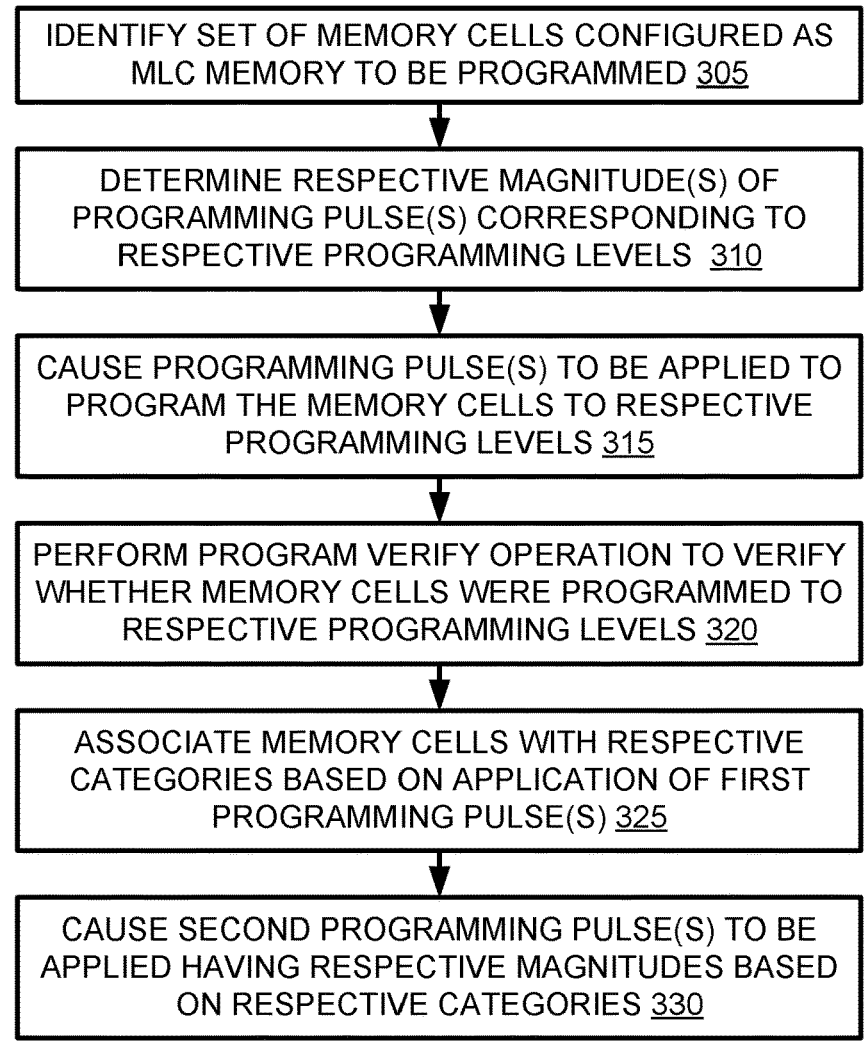
FIG. 3 is a flow diagram of an example method of all levels dynamic start voltage (DSV) programming of a memory device in a memory sub-system in accordance with some embodiments of the present disclosure.

FIG. 3 is a flow diagram of an example method of all levels dynamic start voltage (DSV) programming of a memory device in a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by program manager 134 of FIG. 1 and FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, a set of memory cells is identified. For example, processing logic (e.g., program manager 134) can receive, from a requestor, such as a memory interface 113 of a memory sub-system controller 115, a request to perform a memory access operation on a memory array, such as memory array 250, of a memory device, such as memory device 130. In one embodiment, the memory access operation comprises a program operation directed to a specific address. In one embodiment, the processing logic can identify the set of memory cells (e.g., a subset of the memory cells of memory array 250, such as those memory cells associated with a certain wordline or multiple wordlines of memory array 250), based on the address specified in the received request. In one embodiment, the set of memory cells are configured as MLC memory (e.g., any type of memory cells that store more than one bit per cell including 2 bits, 3 bits, 4 bits, or more bits per cell).

At operation 310, programing pulse magnitudes are determined. For example, the processing logic can determine respective magnitudes for one or more programming pulses to be applied to memory array 250 to program the identified set of memory cells. In one embodiment, the respective magnitudes can correspond to respective programming levels (e.g., 16 programming levels for QLC memory). In one embodiment, indications of the respective magnitudes are stored in a data structure managed by the control logic. For example, program manager 134 can maintain a table, or other data structure, with a number of entries, each corresponding to a respective programming level. Each entry can include an indication of a respective voltage magnitude (Vg), determined from a previous program operation, for a programming pulse to be applied to the gate terminal of a memory cell (e.g., via an associated wordline) in order to program that memory cell to a threshold voltage (Vt) level representing the corresponding programming level. Thus, the respective voltage magnitude (Vg) is determined dynamically from the data structure. For example, if a first threshold voltage (Vt_1) is representative of a first programming level (i.e., associated with a certain four bit value), the associated entry in the table can include an indication of a first voltage magnitude (Vpgm_1) to be applied. In one embodiment, program manager 134 performs a calibration routine, which can double as a first programming operation. In the calibration routine, program manager 134 causes programming pulses having respective default voltage magnitudes corresponding to each programming level to be applied to the memory cells. During a subsequent program verify operation, program manager 134 can determine a number of bytes of data that pass the program verify operation and calculate the corresponding respective threshold voltages associated with respective default voltage magnitudes. If this calibration routine is performed two or more times, enough data is obtained (i.e., the VgVt slope) to predict the threshold voltage for the entire range voltage magnitudes. Accordingly, the respective voltage magnitudes (Vpgm) needed to achieve the desired threshold voltages for each programming level can be determined and stored in the data structure managed by the control logic.

At operation 315, programming pulses are applied. For example, the processing logic can cause one or more programming pulses to be applied to the set of memory cells configured as MLC memory to program the memory cells in the set to respective programming levels as part of the program operation. In one embodiment, program manager 134 can send control signals to one or more driver circuits which drive the respective programming pulses on the wordlines associated with the set of memory cells being programmed. As described above, the respective magnitudes of the one or more programming pulses can correspond to the multiple respective programming levels and can be determined from the data structure managed by the control logic. Depending on the embodiment, the one or more programming pulses applied can include either multiple programming pulses or a single programming pulse.

Figure 4A:
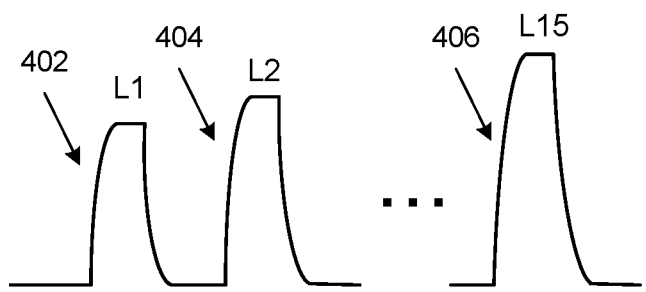
FIGS. 4A-4C are graphs illustrating programming different programming pulse options that can be used for all levels dynamic start voltage (DSV) programming of a memory device in a memory sub-system in accordance with some embodiments of the present disclosure.

For example, as illustrated in FIG. 4A, the applied one or more programming pulses can include multiple programming pulses corresponding to the respective programming levels. After a block erase operation, the memory cells can be at unprogrammed level (L0) and from that level, can be programmed to a number of other programmed levels, each representing a different value of stored data. Thus, there can be a first pulse 402 having a first voltage magnitude corresponding to a first programming level (L1), a second programming pulse 404 having a second voltage magnitude corresponding to a second programming level (L2), and so on, up to a fifteenth programming pulse 406 corresponding to a fifteenth programming level (L15). As illustrated, the applied voltage signal ramps down to a lower voltage (e.g., a ground voltage) in between each pulse, however, an intermediate program verify operation is not performed between each pulse. In one embodiment, the first pulse 402 is applied to all memory cells in the set of memory cells being programmed (i.e., including those cells intended to be programmed to L1 and those cells intended to be programmed to higher programming levels). After the first pulse 402 is applied, those cells intended to be programmed to L1 are inhibited, and the second pulse 404 is applied to the remaining memory cells. This sequence can continue until all memory cells except those intended to be programmed to L15 are inhibited, and the fifteenth pulse 406 is applied.

Figure 4B:
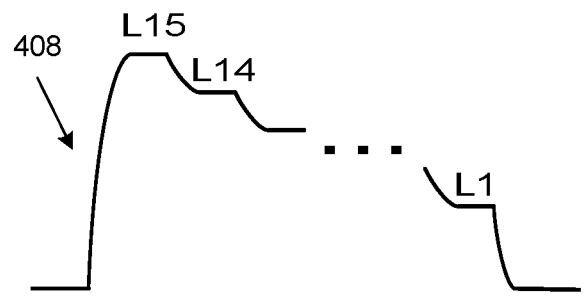

In another example, as illustrated in FIG. 4B, the applied one or more programming pulses can include a single programming pulse 408 having a magnitude that decreases over time to cover each of the respective programming levels. As illustrated, the applied voltage signal starts at a voltage magnitude corresponding to the fifteenth programming level (L15), and after a certain period of time ramps down to a lower magnitude corresponding to the fourteenth programming level (L14). This sequence can continue until the voltage magnitude corresponding to the first programming level (L1) is reached. The applied voltage signal does not ramps down to a lower voltage (e.g., a ground voltage) before ramping back up to the magnitude corresponding to the next programming level. In one embodiment, all memory cells expect those intended to be programmed to L15 are inhibited for the first period of time so that the voltage magnitude corresponding to L15 is applied only to those cells intended to be programmed to L15. During the second period of time, all memory cells expect those intended to be programmed to L15 and L14 are inhibited so that the voltage magnitude corresponding to L14 is applied only to those cells intended to be programmed to L15 and L14. Since the voltage magnitude corresponding to L14 is lower than the voltage magnitude corresponding to L15, however, only those memory cells intended to be programmed to L14 are programmed (while the memory cells intended to be programmed to L15 remain programmed according to the higher voltage magnitude corresponding to L15). This sequence can continue until the voltage magnitude corresponding to the first programming level (L1) is applied to all memory cells.

Figure 4C:
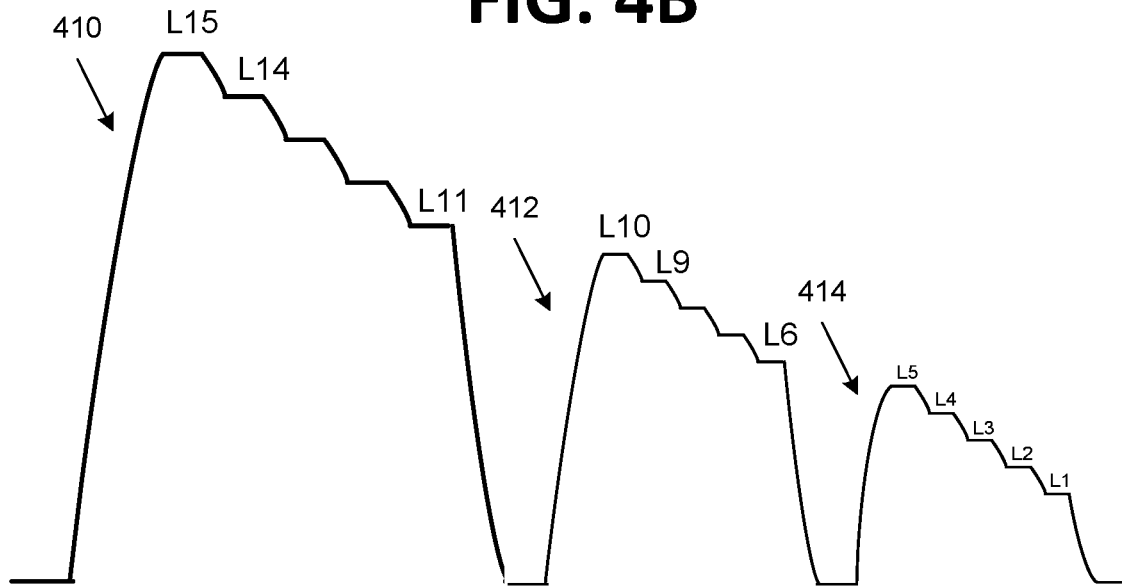

In yet another example, as illustrated in FIG. 4C, the applied one or more programming pulses can include multiple programming pulses each having respective magnitudes that decrease over time to cover a respective subset of the respective programming levels. Thus, there can be a first pulse 410 that starts at a voltage magnitude corresponding to the fifteenth programming level (L15), and after a certain period of time ramps down to a lower magnitude corresponding to the fourteenth programming level (L14). This sequence can continue until the voltage magnitude corresponding to the eleventh programming level (L11) is reached. At that time, the applied voltage signal ramps down to a lower voltage (e.g., a ground voltage), however, an intermediate program verify operation is not performed. Subsequently, there can be a second pulse 412 that starts at a voltage magnitude corresponding to the tenth programming level (L10), and after a certain period of time ramps down to a lower magnitude corresponding to the ninth programming level (L9). This sequence can continue until the voltage magnitude corresponding to the sixth programming level (L6) is reached. At that time, the applied voltage signal ramps down to a lower voltage (e.g., a ground voltage), however, an intermediate program verify operation is not performed. Subsequently, there can be a third pulse 414 that starts at a voltage magnitude corresponding to the fifth programming level (L5), and after a certain period of time ramps down to a lower magnitude corresponding to the fourth programming level (L4). This sequence can continue until the voltage magnitude corresponding to the first programming level (L1) is reached. Thus, as illustrated each of the multiple pulses covers a respective subset of the respective programming levels (e.g., 5 programming levels). In other embodiments, there can be some other number of pulses and/or each pulse can cover some other number of programming levels.

Referring again to FIG. 3, at operation 320, a program verify operation is performed. For example, responsive to the one or more programming pulses being applied, the processing logic can perform a program verify operation to verify whether the memory cells in the set were programmed to the respective programming levels. During the program verify phase, program manager 134 causes a read voltage to be applied to the programmed memory cells (e.g., via the corresponding wordline(s)) to read the level of charge stored at the programmed memory cells to confirm that the desired value was properly programmed (i.e., the target threshold voltage was reached). In one embodiment, the program verify operation is performed only after respective memory cells have been programmed two or more different programming levels (e.g., a first memory cell is programmed to a first programming level and a second memory cell is programmed to a second programming level). In another embodiment, the program verify operation is performed only after respective memory cells have been programmed to all of the different programming levels (e.g., 16 programming levels for QLC memory).

At operation 325, memory cells are categorized. For example, the processing logic can associate the memory cells in the set with respective categories based on the application of the first one or more programming pulses, and the subsequently performed program verify operation. In one embodiment, this includes the application of programming pulses at operation 315 and the program verify operation at operation 320, which can be part of either the first pass or the second pass of a multi-pass program operation. As a result of physical inconsistencies between individual memory cells, each memory cell can react differently to the application of a programming pulse. For example, certain cells can store more charge (i.e., be closer to the respective target threshold voltage) than other cells which store less charge (i.e., are further from the respective target threshold voltage) in response to application of a programming pulse of the same magnitude. This differential between an actual voltage level and the target threshold voltage level can be determined during the program verify operation, and program manager 134 can categorize the memory cells based on the differential. In one embodiment, program manager 134 can associate each memory cell with either a first category (e.g., representing memory cells programmed to lower voltages relative to the respective target voltages) or a second category (e.g., representing memory cells programmed to higher voltages relative to the respective target voltages). In other embodiments, there can be any other number of three or more categories with which the memory cells can be associated.

At operation 330, additional programming pulses are applied. For example, the processing logic can cause one or more second programming pulses to be applied to the memory cells in the set. In one embodiment, these one or more second programming pulses, which can be part of the same pass (i.e., the first pass or the second pass) as the one or more first programming pulses applied at operation 315, can have respective magnitudes based on the respective categories determined at operation 325. For example, if program manager 134 determines that a given memory cell is associated with the first category (e.g., representing memory cells programmed to lower voltages relative to the respective target voltages), program manager 134 can cause a programming pulse with a higher magnitude to be applied during the second pass of the multi-pass program operation. Similarly, if program manager 134 determines that a given memory cell is associated with the second category (e.g., representing memory cells programmed to higher voltages relative to the respective target voltages), program manager 134 can cause a programming pulse with a lower magnitude to be applied during the second pass of the multi-pass program operation. In one embodiment, the magnitude of the second programming pulse applied to a given cell is proportional to the difference between the voltage to which the cell was programmed and the respective target voltage for the cell. In other embodiments, the magnitude of the second programming pulse applied to a given cell can have some other relationship to the difference between the voltage to which the cell was programmed and the respective target voltage for the cell.

Figure 5:
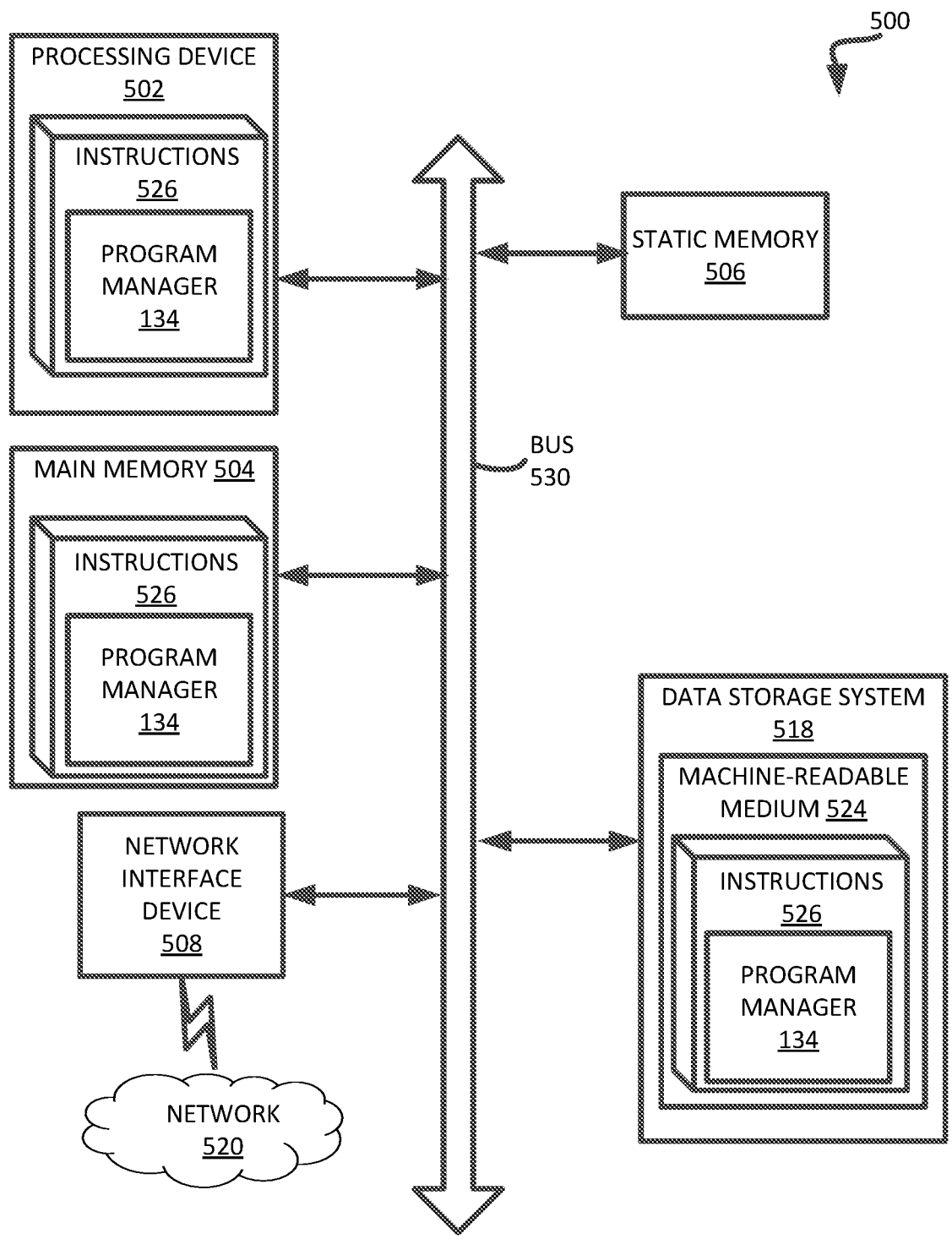
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium, such as a non-transitory computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to program manager 114 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a plurality of memory cells configured as multi-level cell (MLC) memory; and
control logic, operatively coupled with the memory array, to perform operations comprising:
identifying a set of the plurality of memory cells configured as MLC memory to be programmed during a program operation;
determining respective magnitudes for a plurality of programming pulses, the respective magnitudes corresponding to respective programming levels of a plurality of programming levels, wherein indications of the respective magnitudes are stored in a data structure managed by the control logic, and wherein the respective magnitudes for the plurality of programming pulses are based at least in part on a previous program operation;
causing the plurality of programming pulses to be applied, without intermediate program verify operations, to at least a portion of the set of the plurality of memory cells configured as MLC memory to program memory cells in the set of memory cells configured as MLC memory to the respective programming levels of the plurality of programming levels as part of the program operation, wherein the plurality of programming pulses each have respective magnitudes that decrease over time to cover a respective subset of the respective programming levels of the plurality of programming levels, and wherein each successive programming pulse has an initial magnitude that is lower than a final magnitude of a previous programming pulse; and
responsive to the plurality of programming pulses being applied, performing a program verify operation to verify whether the memory cells in the set of memory cells configured as MLC memory were programmed to the respective programming levels of the plurality of programming levels.

2. The memory device of claim 1, wherein the plurality of programming pulses are applied to program a first memory cell of the set of the plurality of memory cells configured as MLC memory to a first programming level of the plurality of programming levels and to program a second memory cell of the set of the plurality of memory cells configured as MLC memory to a second programming level of the plurality of programming levels.

3. The memory device of claim 1, wherein the program verify operation is not performed until all of the plurality of programming pulses have been applied to program the memory cells in the set of memory cells configured as MLC memory to the respective programming levels of a plurality of programming levels.

4. The memory device of claim 1, wherein the plurality of programming pulses correspond to the respective programming levels of the plurality of programming levels.

5. The memory device of claim 1, wherein the control logic is to perform further operations comprising:
 associating the memory cells in the set of memory cells configured as MLC memory with a respective plurality of categories based on application of the plurality of programming pulses and the program verify operation; and
 causing one or more second programming pulses to be applied to the memory cells in the set of memory cells configured as MLC memory, the one or more second programming pulses having respective magnitudes based on the respective plurality of categories.

6. A method comprising:
 identifying a set of a plurality of memory cells in a memory device configured as multi-level cell (MLC) memory to be programmed during a program operation;
 determining respective magnitudes for a plurality of programming pulses, the respective magnitudes corresponding to respective programming levels of a plurality of programming levels, wherein indications of the respective magnitudes are stored in a data structure managed by a control logic, and wherein the respective magnitudes for the plurality of programming pulses are based at least in part on a previous program operation;
 causing the plurality of programming pulses to be applied, without intermediate program verify operations, to at least a portion of the set of the plurality of memory cells configured as MLC memory to program memory cells in the set of memory cells configured as MLC memory to the respective programming levels of the plurality of programming levels as part of the program operation, wherein the plurality of programming pulses each have respective magnitudes that decrease over time to cover a respective subset of the respective programming levels of the plurality of programming levels, and wherein each successive programming pulse has an initial magnitude that is lower than a final magnitude of a previous programming pulse; and
 responsive to the plurality of programming pulses being applied, performing a program verify operation to verify whether the memory cells in the set of memory cells configured as MLC memory were programmed to the respective programming levels of the plurality of programming levels.

7. The method of claim 6, wherein the plurality of programming pulses are applied to program a first memory cell of the set of the plurality of memory cells configured as MLC memory to a first programming level of the plurality of programming levels and to program a second memory cell of the set of the plurality of memory cells configured as MLC memory to a second programming level of the plurality of programming levels.

8. The method of claim 6, wherein the program verify operation is not performed until all of the plurality of programming pulses have been applied to program the memory cells in the set of memory cells configured as MLC memory to the respective programming levels of a plurality of programming levels.

9. The method of claim 6, wherein the plurality of programming pulses correspond to the respective programming levels of the plurality of programming levels.

10. The method of claim 6, further comprising:
 associating the memory cells in the set of memory cells configured as MLC memory with a respective plurality of categories based on application of the plurality of programming pulses and the program verify operation; and
 causing one or more second programming pulses to be applied to the memory cells in the set of memory cells configured as MLC memory, the one or more second programming pulses having respective magnitudes based on the respective plurality of categories.

11. A method comprising:
 identifying a wordline of a memory array of a memory device to be programmed, the wordline comprising a plurality of memory cells;
 determining respective magnitudes for one or more programming pulses, the respective magnitudes corresponding to a first programming level and a second programming level, wherein indications of the respective magnitudes are stored in a data structure associated with the memory device, and wherein the respective magnitudes for the one or more programming pulses are based at least in part on a previous program operation;
 causing the one or more programming pulses to be applied to the wordline to program a first memory cell of the plurality of memory cells to the first programming level and, without performing an intermediate program verify operation, to program a second memory cell of the plurality of memory cells to the second programming level, wherein the one or more programming pulses each have respective magnitudes that decrease over time to cover a respective subset of the respective programming levels of the plurality of programming levels, and wherein each successive programming pulse has an initial magnitude that is lower than a final magnitude of a previous programming pulse; and
 after programming the first memory cell to the first programming level and the second memory cell to the second programming level, performing a program verify operation on the first memory cell and the second memory cell.

12. The method of claim 11, wherein the one or more programming pulses comprise a first programming pulse corresponding to the first programming level and a second programming pulse corresponding to the second programming level.

* * * * *